United States Patent [19]

Brambilla et al.

[11] Patent Number: 5,204,638
[45] Date of Patent: Apr. 20, 1993

[54] INTRINSIC OFFSET RECOVERY CIRCUIT PARTICULARLY FOR AMPLIFIERS

[75] Inventors: Davide Brambilla, Rho; Fabrizio Stefani, Cardano al Campo, both of Italy

[73] Assignee: SGS-Thomson Microelectronics S.r.l., Milan, Italy

[21] Appl. No.: 808,492

[22] Filed: Dec. 17, 1991

[30] Foreign Application Priority Data

Dec. 20, 1990 [IT] Italy ................................. 22447 A/90

[51] Int. Cl.$^5$ ................................................ H03F 3/45
[52] U.S. Cl. ..................................... 330/252; 330/257
[58] Field of Search .................... 330/9, 252, 257, 258, 330/261, 296, 311

[56] References Cited

U.S. PATENT DOCUMENTS 4,030,044 6/1977 Davis .................................. 330/252
5,105,145 4/1992 Neth ................................ 330/257 X Primary Examiner—Steven Mottola
Attorney, Agent, or Firm—Townsend and Townsend

[57] ABSTRACT

Intrinsic offset recovery circuit particularly for amplifiers, which comprises an input differential amplifier constituted by a first PNP transistor, by a second PNP transistor, by a third NPN transistor, by a fourth NPN transistor and by a first constant-current source, and a unitary-gain output stage. The recovery circuit furthermore comprises, as connection between the input differential amplifier and the unitary-gain output stage, a gain stage which comprises a fifth NPN transistor which is connected to the output of the input differential amplifier and is connected to a sixth NPN transistor and to a seventh PNP transistor. The seventh transistor is connected to the sixth transistor. The seventh transistor and the sixth transistor are connected to the unitary-gain output stage.

18 Claims, 1 Drawing Sheet

INTRINSIC OFFSET RECOVERY CIRCUIT PARTICULARLY FOR AMPLIFIERS

BACKGROUND OF THE INVENTION

The present invention relates to an intrinsic offset recovery circuit particularly for amplifiers.

The use of differential amplifiers in operational amplifiers and in other types of circuits is currently extremely widespread. In the applications of these amplifiers in which good precision is required, said differential amplifiers must have a low offset.

This means that the device, such as an operational amplifier, which includes the differential amplifier must be balanced, i.e. the voltage across the differential circuit must be zero.

The offset can be due on one hand to mismatches of the various components which constitute the device and on the other hand to the type of circuit itself, which produces systematic offsets, also known as intrinsic offsets.

SUMMARY OF THE INVENTION

The aim of the present invention is to eliminate the disadvantages described above in known types of operational amplifiers by providing an intrinsic offset recovery circuit particularly for amplifiers, which eliminates intrinsic offsets.

Within the scope of the above aim, an object of the present invention is to provide a recovery circuit which can be easily integrated.

Not the least object of the present invention is to provide a recovery circuit which is relatively easy to manufacture and at competitive costs.

This aim, the objects mentioned and others which will become apparent hereinafter are achieved by an intrinsic offset recovery circuit particularly for amplifiers, which, according to the invention, comprises an input differential amplifier constituted by a first PNP transistor, by a second PNP transistor, by a third NPN transistor, by a fourth NPN transistor and by a first constant-current source, and a unitary-gain output stage, characterized in that the recovery circuit it comprises, as connection between said input differential amplifier and said unitary-gain output stage, a gain stage which comprises a fifth NPN transistor which is connected to the output of said input differential amplifier and is connected to a sixth NPN transistor and to a seventh PNP transistor, said seventh PNP transistor being connected to said sixth transistor, said seventh transistor and said sixth transistor being connected to said unitary-gain output stage.

BRIEF DESCRIPTION OF THE DRAWINGS

Further characteristics and advantages of the invention will become apparent from the description of a preferred but not exclusive embodiment of an intrinsic offset recovery circuit particularly for amplifiers, according to the invention, illustrated only by way of non-limitative example in the accompanying drawings, wherein.

DESCRIPTION OF THE PREFERRED EMBODIMENTS

Figure 1:
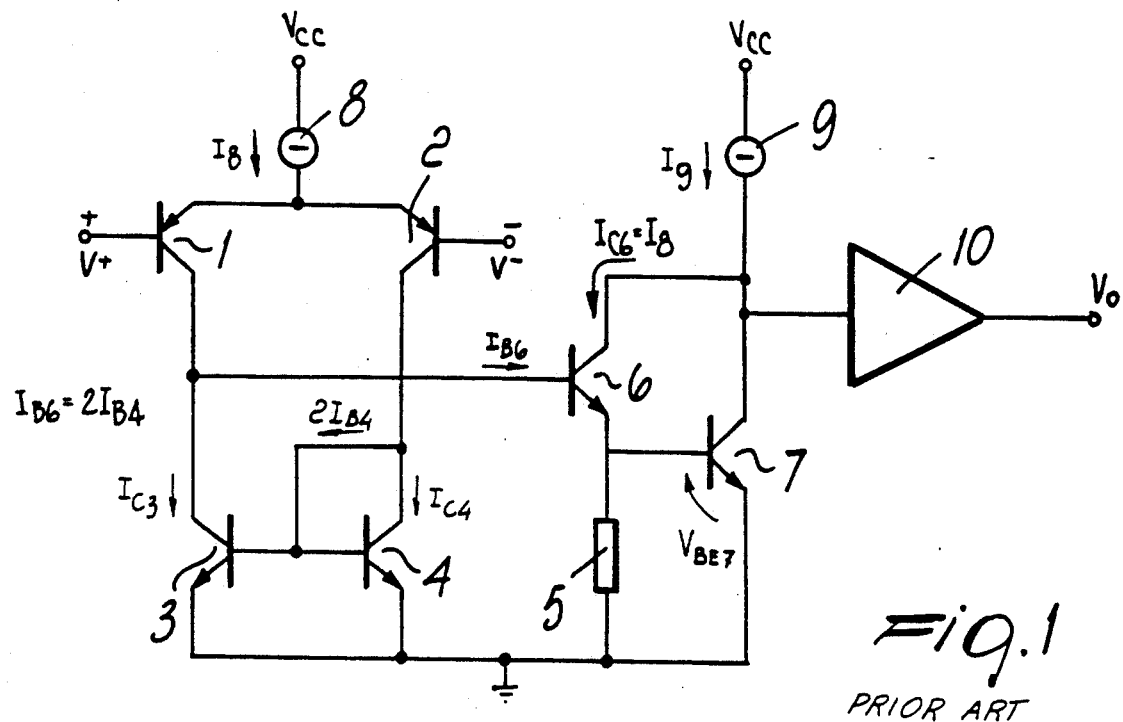
FIG. 1 is a circuit diagram of a known operational amplifier.

With reference to figure a known operational amplifier comprises an input stage constituted by a differential amplifier. The differential amplifier comprises a first PNP transistor 1 and a second PNP transistor 2, whose base terminals are affected by the input signals V+ and V−, as well as a third NPN transistor 3 and a fourth transistor 4, whose emitter terminals are connected to one another, to a terminal of a resistor 5 and to the emitter terminal of a sixth NPN transistor 7.

The collector terminals of the first transistor 1 and of the third transistor 3 are mutually connected, and so are the related collector terminals of the second transistor 2 and of the fourth transistor 4. The emitter terminals of the first transistor 1 and of the second transistor 2 are connected to one another and to a first constant-current source 8.

The base terminals of the third transistor 3 and of the fourth transistor 4 are connected to one another and to the collectors of the second transistor 2 and of the fourth transistor 4. The output of the differential stage branches from the connection between the collectors of the first transistor 1 and of the third transistor 3 is connected to the base terminal of a fifth NPN transistor 6.

The emitter terminal of the fifth transistor 6 is connected, by means of the resistor 5, to the emitter terminals of the third transistor 3 and of the fourth transistor 4 and to the emitter terminal of the sixth transistor 7. The collector terminal of the fifth transistor 6 is connected to a second constant-current source 9, to the collector terminal of the sixth transistor 7 and to the input terminal of the unitary-gain output stage 10.

The connection of the fifth transistor 6 and of the sixth transistor 7 is the well-known Darlington amplifier or connection.

The collector currents of the third transistor 3 ($I_{C3}$) and of the fourth transistor 4 ($I_{C4}$) are identical, since the voltages between the base and the emitter in said transistors are the same. If the input differential voltage ($V_D = V^+ - V^-$) must be zero when the amplifier is balanced, the collector currents of the first transistor 1 and of the second transistor 2 must be equal ($I_{C1} = I_{C2}$). In order to obtain this result, the base current of the fifth transistor 6 ($I_{B6}$) must be equal to twice the base current ($I_{B4}$) of the fourth transistor 4, i.e. $I_{B6} = 2I_{B4}$.

Assuming the third transistor 3, the fourth transistor 4 and the fifth transistor 6 are identical, the collector current of the fifth transistor 6 must be equal to twice the collector current of the fourth transistor 4, i.e. $I_{C6} = I_8$.

The technical problem which the present invention aims to solve is that the collector current $I_{C6}$ of the fifth transistor 6 varies considerably, especially with the temperature, since it depends on the base-emitter voltage $V_{BE7}$ of the sixth transistor 7 and on the resistance value of the resistor 5, whereas $I_8$ cannot be made to vary in the same manner, since the current of the differential amplifier must generally be constant in order to avoid frequency instability problems.

Figure 2:
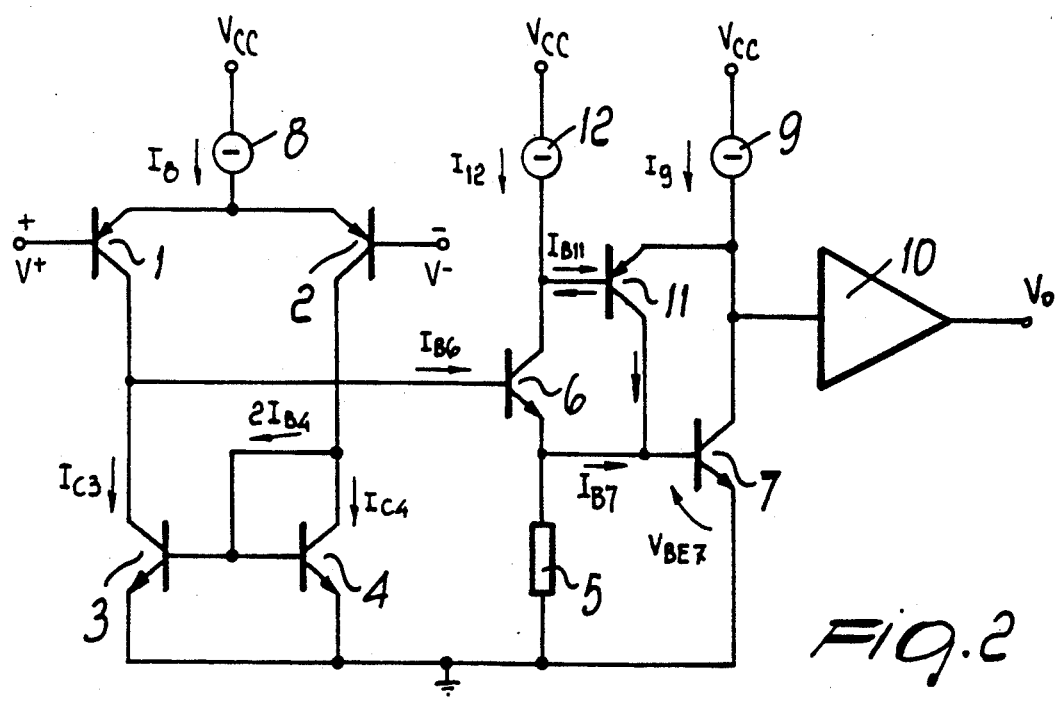
FIG. 2 is a circuit diagram of an operational amplifier provided with a recovery circuit according to the invention.

With reference to FIG. 2, an intrinsic offset recovery circuit particularly for amplifiers comprises an input differential amplifier, constituted by a first PNP transistor 1, by a second PNP transistor 2, by a third NPN transistor 3, by a fourth NPN transistor 4 and by a first constant-current source 8, whose reference numerals correspond to those given previously, and a unitary-gain output stage 10.

The recovery circuit furthermore comprises, as connection between the input differential amplifier and the unitary-gain output stage 10, a gain stage which comprises a fifth NPN transistor 6, which has its base terminal connected to the output of the input differential amplifier and is connected to a sixth NPN transistor 7 and to a seventh PNP transistor 11. Said seventh transistor is connected to the sixth transistor 7. The seventh transistor 11 and the sixth transistor 7 are connected to the unitary-gain output stage 10.

The emitter terminal of the seventh transistor 11 is connected to a second constant-current source 9, to the collector terminal of the sixth transistor 7 and to the unitary-gain output stage 10.

The base terminal of the fifth transistor 6 is connected to the collector terminals of the first transistor 1 and of the third transistor 3. The emitter terminal of the fifth transistor 6 is connected, by means of a resistor 5, to the emitter terminals of the third transistor 3, of the fourth transistor 4 and of the sixth transistor 7, to the base terminal of the sixth transistor 7 directly and to the collector terminal of the seventh transistor 11. The collector terminal of the fifth transistor 6 is connected to the base terminal of the seventh transistor 11 and to a third constant-current source 12.

In the invention, the fifth transistor 6 is driven by the current $I_{12}$ of the third source 12, ignoring the base current $I_{B11}$ of the seventh transistor 11.

The current $I_{12}$ must always be smaller than the current required in order to exactly have a base-emitter voltage $V_{BE}$, and in particular the base-emitter voltage $V_{BE7}$ of the sixth transistor 7, across the resistor 5, otherwise the sixth transistor 7 would be in its saturation operating area.

The remaining amount of current required in order to exactly have the base-emitter voltage $V_{BE7}$ on the resistor 5 and the base current $I_{B7}$ is provided by the seventh transistor 11.

If $I_8 = I_{12}$ in the circuit according to the invention, then $I_{B6} = 2I_{B4}$, i.e. the above described balance condition occurs, and the intrinsic offsets across the differential amplifier due to the different collector currents of the third transistor 3 and of the fourth transistor 4 are eliminated.

Advantageously, the circuit according to the invention allows the provision of an operational amplifier which has no intrinsic offsets, i.e. offsets not due to mismatches of the various components.

The condition for achieving this purpose is that the relation $I_8 = I_{12}$ must be true, since it is relatively easy, especially in integrated circuits, to provide identical current sources.

Conveniently, the collector current $I_{C6}$ of the fifth transistor 6 is constant in all operating conditions, whereas on the contrary, in the circuit illustrated in FIG. 1 which relates to the known art, the collector current $I_{C6}$ must also provide the base current $I_{B7}$ to the sixth transistor 7, and this current may be very high: generally, in fact, $I_g >> I_{C6}$, and the current furthermore varies in dynamic conditions together with the output signal.

In applications, such as variable-transconductance amplifiers, in which a variable $I_8$ is required, zero offset is advantageously obtained in all operating conditions by varying $I_{12}$ in the same manner.

The invention thus conceived is susceptible to numerous modifications and variations, all of which are within the scope of the inventive concept. All the details may furthermore be replaced with other technically equivalent elements.

In practice, the materials employed, as well as the dimensions, may be any according to the requirements.

We claim:

1. In an amplifier circuit having an input differential amplifier having a first PNP transistor, a second PNP transistor, a third NPN transistor, a fourth NPN transistor, a first constant-current source, and a unitary-gain output stage, an intrinsic offset recovery circuit connected between said input differential amplifier and said unitary-gain output stage, comprising a gain stage having a fifth NPN transistor connected to the output of said input differential amplifier and to a sixth NPN transistor and to a seventh PNP transistor, said seventh transistor being connected to sixth transistor, said seventh transistor and said sixth transistor connected to said unitary-gain output stage.

2. The circuit according to claim 1, wherein the emitter terminal of said seventh transistor is connected to a second constant-current source, to the collector terminal of said sixth transistor and to said unitary-gain output stage.

3. The circuit according to claim 2, wherein the base terminal of said fifth transistor is connected to the collector terminals of said first transistor and of said third transistor, the emitter terminal of said fifth transistor being connected, by means of a resistor, to the emitter terminals of said third transistor, of said fourth transistor and of said sixth transistor, to the base terminal of said sixth transistor and to the collector terminal of said seventh transistor, the collector terminal of said fifth transistor being connected to the base terminal of said seventh transistor and to a third constant-current source.

4. The circuit according to claim 1 wherein said circuit comprises part of an integrated circuit.

5. The circuit according to claim 3 wherein a current from said first current source is equal to a current from said third constant current source.

6. An amplifier circuit for operation between first and second voltage supplies in an integrated circuit, said amplifier circuit comprising an input differential stage having a first current source connected to said first voltage supply, first and second current sinks connected to said second voltage supply, a current through said first current sink mirroring a current through said second current sink, first and second bipolar transistors, each bipolar transistor connected between said first current supply, and said first and second current sinks respectively, said first and second bipolar transistors having first and second base terminals respectively forming first and second input terminals to said input differential stage;

an output stage having an input terminal and an output terminal, said output terminal forming an output terminal for said amplifier circuit; and a stage intermediate said input differential stage and said output stage, said intermediate stage having second and third current sources each connected to said first voltage supply, third and fourth bipolar transistors, and a resistive means connected to said second voltage supply, said input terminal of said output stage connected to said third current source, said third bipolar transistor connected between said second current source and said resistive means, said third bipolar transistor having an input terminal connected to a node between said first bipolar transistor and said first current sink, said fourth bipolar transistor connected between said input terminal of said output stage and said second voltage supply, said fourth bipolar transistor having an input terminal connected to a node between said third bipolar transistor and said resistive means;

whereby a current through said third bipolar transistor is substantially decoupled from a current through said fourth bipolar transistor so that said intermediate stage operates as an intrinsic offset recovery circuit for said input differential stage.

7. The amplifier circuit according to claim 6 further comprising a fifth bipolar transistor connected between said third current source and said input terminal of said fourth bipolar transistor, said fifth bipolar transistor having an input terminal connected to said second current source.

8. The amplifier circuit according to claim 6 wherein said third, fourth and fifth bipolar transistors are of equal size and a current through said third bipolar transistor is substantially equal to said current from said first current source.

9. The amplifier circuit according to claim 6 wherein said second current source has a current of equal magnitude as that of said first current source.

10. The amplifier circuit according to claim 9 wherein said current sources are constant.

11. The amplifier circuit according to claim 6 wherein said third and fourth bipolar transistors comprise PNP transistors, said third bipolar transistor having a collector terminal connected to said second current source, an emitter terminal connected to said resistive means and a base terminal connected to said node between said first bipolar transistor and said first current sink, said fourth bipolar transistor having a collector terminal connected to said third current source and said input terminal of said output stage, an emitter terminal connected to said second voltage supply and a base terminal connected to said emitter terminal of said third bipolar transistor.

12. The amplifier circuit according to claim 11 wherein said fifth bipolar transistor comprises a NPN transistor, said fifth transistor having an emitter terminal connected to said third current source, a collector terminal connected to said base terminal of said fourth bipolar transistor, and a base terminal connected to said collector terminal of said third bipolar transistor.

13. The amplifier circuit according to claim 12 wherein said first and second bipolar transistors comprise PBP transistors, said first and second bipolar transistors each having an emitter terminal connected in common to said first current source, a base terminal forming first and second input terminals respectively, and a collector terminal connected to first and second current sinks respectively.

14. The amplifier circuit according to claim 13 wherein said first and second current sinks each comprises a NPN bipolar transistor, said first current sink bipolar transistor having a collector terminal connected to a collector terminal of said first bipolar transistor, said second current sink bipolar transistor having a collector terminal connected to a collector terminal of said second bipolar transistor, said first and second current sink bipolar transistors each having a base terminal connected in common to said collector terminal of said second current sink bipolar transistor, and an emitter terminal connected in common to said second voltage supply.

15. The circuit according to claim 1 wherein said fifth NPN transistor is connected to said sixth NPN transistor in a Darlington configuration.

16. In an amplifier circuit having an input differential amplifier having a first PNP transistor, a second PNP transistor, a third NPN transistor, a fourth NPN transistor, a first constant-current source, and a unitary-gain output stage, an intrinsic offset recovery circuit connected between said input differential amplifier and said unitary-gain output stage, comprising a gain stage having a fifth NPN transistor connected to the output of said input differential amplifier and to a sixth NPN transistor and to a seventh PNP transistor, said seventh transistor being connected to said sixth transistor, said seventh transistor and said sixth transistor connected to said unitary-gain output stage and providing a current substantially tracking said first constant-current source of said differential amplifier to said fifth NPN transistor.

17. The circuit according to claim 16, wherein the emitter terminal of said seventh transistor is connected to a second constant-current source, to the collector terminal of said sixth transistor and to said unitary-gain output stage.

18. The circuit according to claim 17, wherein the base terminal of said fifth transistor is connected to the collector terminals of said first transistor and of said third transistor, the emitter terminal of said fifth transistor being connected, by means of a resistor, to the emitter terminals of said third transistor, of said fourth transistor and of said sixth transistor, to the base terminal of said sixth transistor and to the collector terminal of said seventh transistor, the collector terminal of said fifth transistor being connected to the base terminal of said seventh transistor and to a third constant-current source.

* * * * *

UNITED STATES PATENT AND TRADEMARK OFFICE
CERTIFICATE OF CORRECTION

PATENT NO. : 5,204,638
DATED : April 20, 1993
INVENTOR(S) : Davide Brambilla et al It is certified that error appears in the above-indentified patent and that said Letters Patent is hereby corrected as shown below:

On the title page, box [73] Assignee:, please delete "SGS-Thomson Microelectronics, S.r.l., Italy" and replace with --SGS-Thomson Microelectronics, S.r.l., 20041 Agrate Brianza (Prov. of Milan), Italy--

Signed and Sealed this

Eighteenth Day of January, 1994

Attest:

BRUCE LEHMAN

*Attesting Officer*  *Commissioner of Patents and Trademarks*